United States Patent

Sagalovich et al.

[11] Patent Number: 5,614,811
[45] Date of Patent: Mar. 25, 1997

[54] POWER LINE CONTROL SYSTEM

[75] Inventors: Emil Sagalovich, Thornhill; Alexei Bogdan, Bolton, both of Canada

[73] Assignee: Dyalem Concepts, Inc., Kanata, Canada

[21] Appl. No.: 534,090

[22] Filed: Sep. 26, 1995

[51] Int. Cl.$^6$ .............................. G05F 1/70; H04Q 1/00; H03K 17/60
[52] U.S. Cl. ................. 323/207; 307/140; 340/310.06; 340/825.04; 340/825.57
[58] Field of Search ..................... 323/205, 207, 323/319, 325; 307/3, 140; 340/310.01, 310.02, 310.03, 310.04, 310.06, 310.07, 825.04, 825.6, 825.7, 825.8, 825.54, 825.57

[56] References Cited

U.S. PATENT DOCUMENTS

| | | | |
|---|---|---|---|
| 3,573,384 | 4/1971 | Konidaris et al. | 179/18 |
| 3,646,439 | 2/1972 | Broski | 323/21 |
| 4,300,126 | 11/1981 | Gajjar | 340/310 A |
| 4,328,482 | 5/1982 | Belcher et al. | 340/310 A |
| 4,443,712 | 4/1984 | Gokita | 307/140 |
| 4,499,452 | 2/1985 | Nicolas | 340/310 A |
| 4,602,253 | 7/1986 | Kreft | 340/825.31 |
| 4,731,810 | 3/1988 | Watkins | 379/33 |
| 4,746,809 | 5/1988 | Coleman et al. | 307/1 |
| 4,755,792 | 7/1988 | Pezzolo et al. | 340/538 |
| 4,788,527 | 11/1988 | Johansson | 340/310 A |
| 4,835,517 | 5/1989 | Van der Gracht et al. | 340/310 A |
| 4,847,781 | 7/1989 | Brown, III et al. | 364/492 |
| 4,916,642 | 4/1990 | Kaiser et al. | 364/550 |
| 4,963,853 | 10/1990 | Mak | 340/310 A |
| 4,996,513 | 2/1991 | Mak et al. | 340/310 R |
| 5,005,187 | 4/1991 | Thompson | 375/94 |
| 5,070,442 | 12/1991 | Syron-Townson et al. | 364/146 |
| 5,189,412 | 2/1993 | Mehta et al. | 340/825.22 |
| 5,200,743 | 4/1993 | St. Martin et al. | 340/825.07 |
| 5,227,762 | 7/1993 | Guidette et al. | 340/310 R |
| 5,233,646 | 8/1993 | Kuromi | 379/102 |
| 5,327,230 | 7/1994 | Dockery | 348/8 |
| 5,334,975 | 8/1994 | Wachob et al. | 340/825.21 |
| 5,351,272 | 9/1994 | Abraham | 375/38 |
| 5,365,154 | 11/1994 | Schneider et al. | 318/103 |
| 5,541,584 | 7/1996 | Mehta et al. | 340/825.57 |

OTHER PUBLICATIONS

ADEMCO brochure for "PowerLine Carrier Devices," Oct. 20, 1993 (Syosset, NY).
"TV's, Baby Monitors Stop Spread Spectrum Signal," 2 *LO News*, (date & place of publication unknown).

*Primary Examiner*—Peter S. Wong
*Assistant Examiner*—Adolf Berhane
*Attorney, Agent, or Firm*—Chadbourne & Parke LLP

[57] ABSTRACT

The present invention provides a system and a method for controlling electrical devices connected to an AC power line by means of control signals transmitted over the AC power line. The control system consists of a transmitter apparatus and a receiver apparatus. The transmitter apparatus generates, and transmits via an AC power line, multiple voltage pulses during any one-half cycle of the AC power line voltage. The multiple voltage pulses act as control signals for any electrical device that is sought to be controlled, or a "slave" device. The receiver apparatus is simultaneously coupled to the slave device and the AC power line for receiving and, if necessary, decoding the voltage pulses sent by the transmitter apparatus. The receiver apparatus in turn generates a command signal that controls the slave device's operation.

20 Claims, 9 Drawing Sheets

POWER LINE CONTROL SYSTEM

FIELD OF THE INVENTION

This invention relates generally to a system and a method for transmitting control signals over electrical power lines, and relates more particularly to a system and a method for controlling electrical apparatuses connected to alternating current power lines by means of control pulses transmitted over the power lines.

BACKGROUND OF THE INVENTION

Power lines of most electrical power supply systems transmit electrical power of alternating current (AC) at a chosen operating voltage (e.g., 110 V, 120 V or 220 V AC) and operating frequency (usually 50 Hz or 60 Hz) via one or more phases (e.g., single-phase, two-phase or three-phase configuration). Amongst several methods which have been devised for controlling output-type electrical apparatuses connected to a given electrical power line, the simplest technique involves the use of an input device, such as on/off switch, to be connected directly to the output-type electrical device, e.g., a light bulb or a heater. However, this method suffers from the obvious problems of being very cumbersome and requiring manual control.

Another known technique for controlling electrical apparatuses connected to a power line is an indirect control method, which involves the use of control systems such as programmable logic controllers (PLC) or distributed control systems (DCS), where all inputs and outputs are isolated from each other. Due to the cost associated with the above-mentioned control systems, the indirect control method has been used almost exclusively in industrial applications.

Yet another technique for controlling electrical apparatuses connected to a power line involves transmitting electrical control signals over the given electrical power line. Most existing methods of transmitting electrical control signals over electrical power lines utilize high frequency (i.e., frequencies at least two orders of magnitude higher than the power line frequencies of 50 Hz/60 Hz or 200 Hz/400 Hz) transmission for communication between two ports physically connected to the power line. Typically, ultrasonic frequencies (in the case of office telephones), amplitude modulated (AM) radio frequencies (RF), or frequency modulated (FM) radio frequencies are utilized in order to reduce line noises and increase sensitivity and selectivity.

All control methods which are based on radio frequency (RF) communication experience several problems. First, RF communication methods are very sensitive to electrical noises, especially when an electrical system has any reactive (capacitive or inductive) load. Second, RF communication generates so-called "RF pollution," which can be detected outside of the system. Third, RF signals penetrate other electrical systems that are connected to the same power source, leaving the control system vulnerable to detection and manipulation by intruders. In addition, RF systems are bulky, expensive, employ many electronic components and require FCC approval for use. Finally, all devices which are sought to be controlled by the RF system must be plugged into the control apparatus; there is no RF-control product on the market suitable for retrofit applications.

A somewhat different method of transmitting electrical control signals over electrical power lines utilizes the principle of sending a control signal to an electrical device connected to a power line during a period of time when the sine-wave of the AC power line voltage passes the zero potential, i.e., when a "zero crossing" occurs. By way of example, for a 60 Hz power line zero crossings occur 120 times per second, or once every 8.3 milliseconds. An output-controlling signal is generated by a voltage pulse created from a discharge of a capacitor that has been charged to one-half of the peak-to-peak voltage value of the power line in the preceding half of the AC sine-wave cycle. These pulses can then be detected along the length of the power line if the pulses have sufficient magnitude to compensate for the attenuation. This method of sending a voltage pulse generated from a capacitor to control electrical devices coupled to a power line is described in U.S. Pat. No. 4,328,482 issued to Paul Belcher and Daniel Hobel, entitled "REMOTE AC POWER CONTROL WITH CONTROL PULSES AT THE ZERO CROSSING OF THE AC WAVE."

Figure 3:
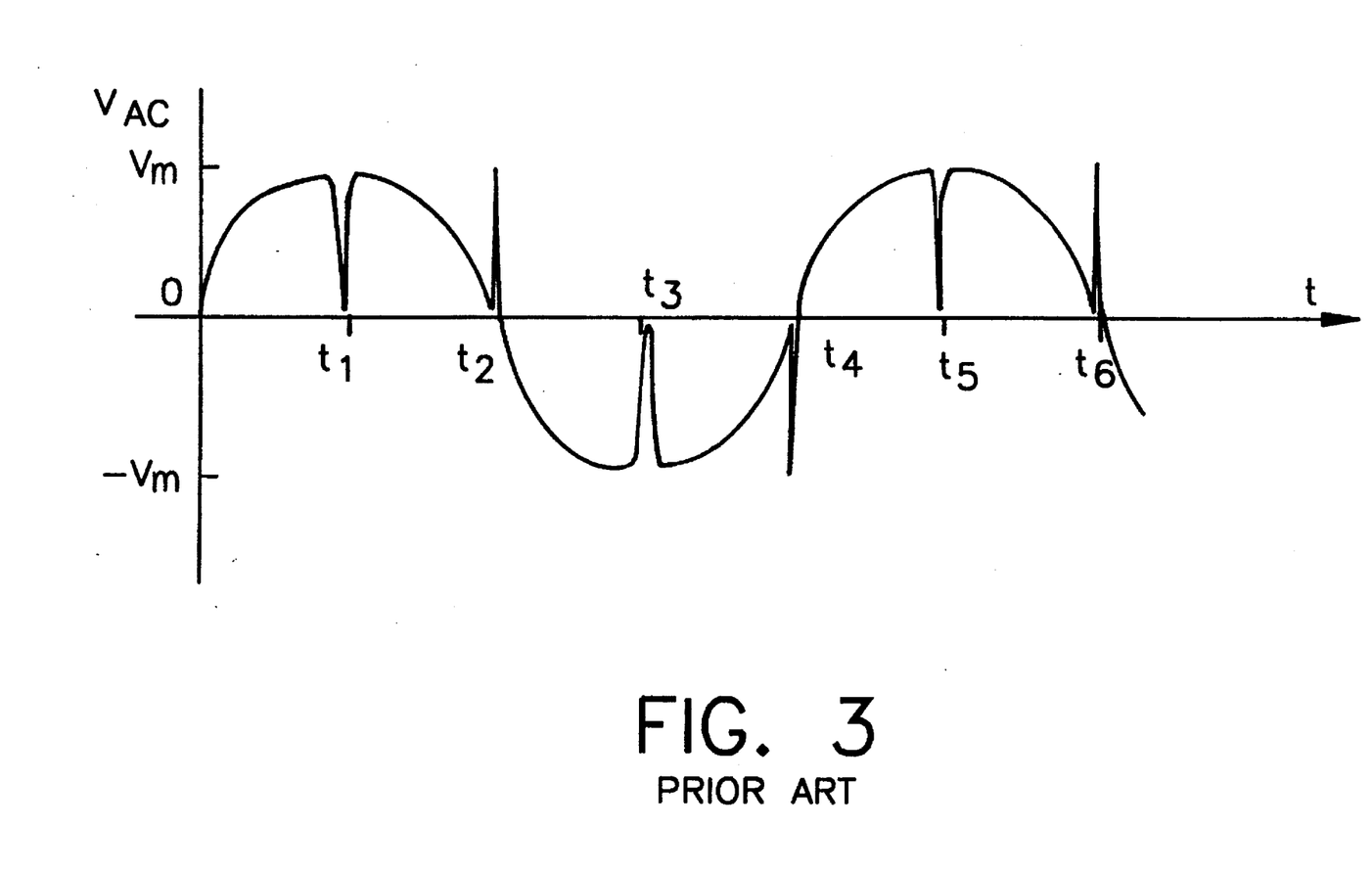
FIG. 3 is time-versus-voltage graph of a single-phase, AC power line voltage where a prior art control device connected to the AC power line transmits control pulses.
Figure 4:
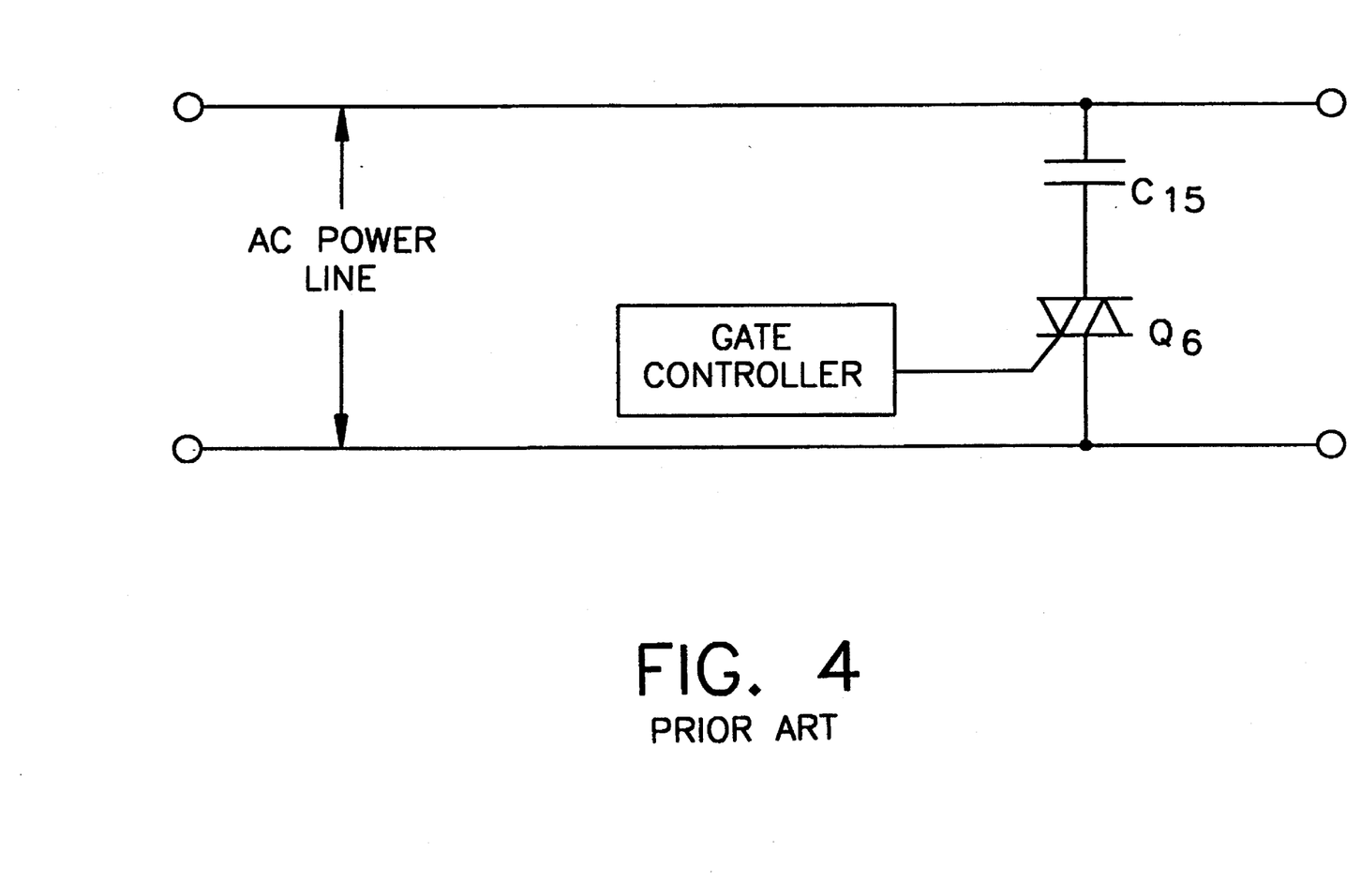
FIG. 4 is a circuit diagram of a portion of the prior art control device which generates the voltage-versus-time graph of FIG. 3.
Figure 5:
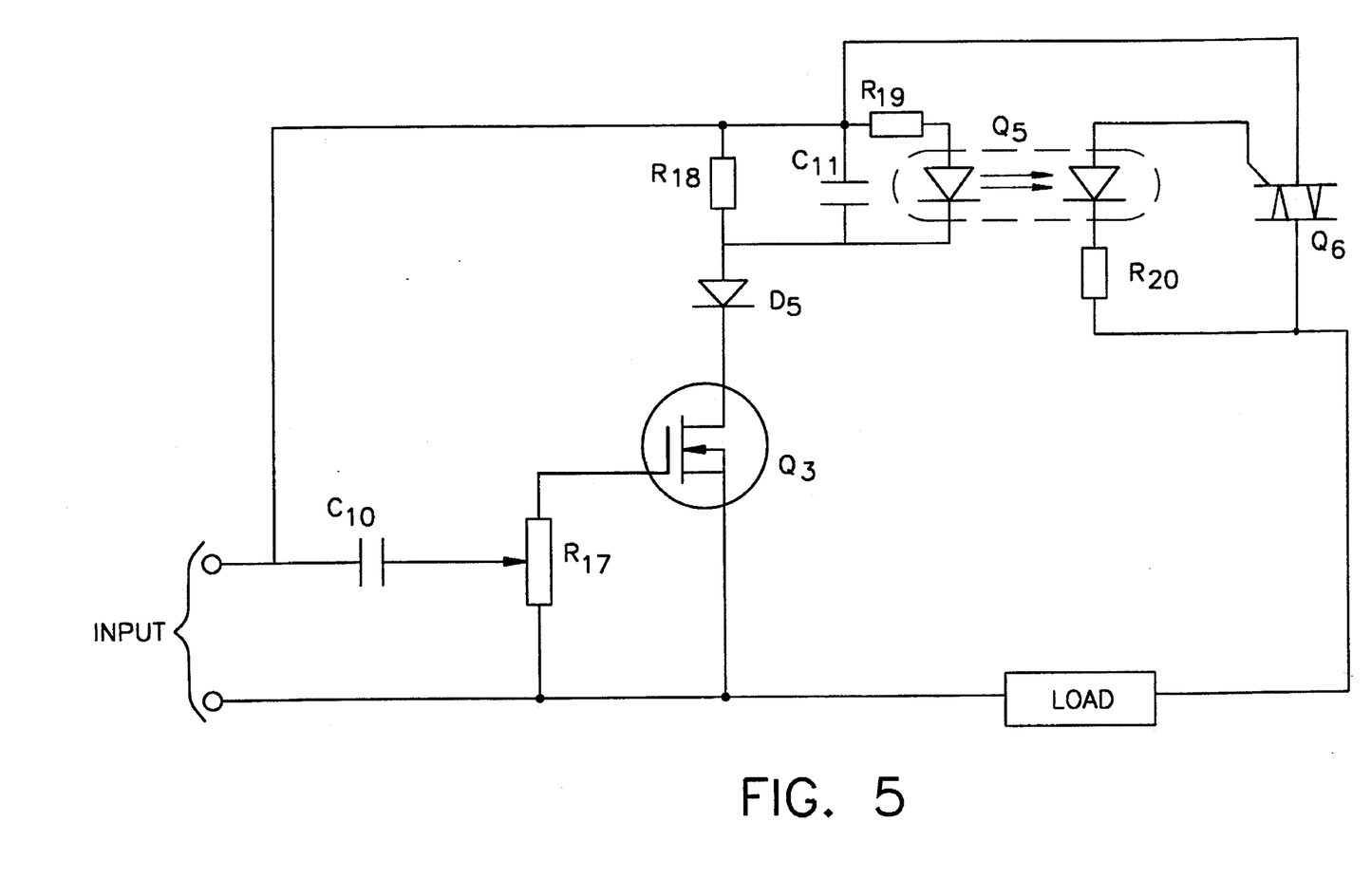
FIG. 5 is a first preferred embodiment of the receiver apparatus of the control system according to the present invention.

The method described in U.S. Pat. No. 4,328,482 suffers from several shortcomings. First, because the pulse-generating capacitor is directly dependent on the line voltage for the charging of energy, the pulse-generating capacitor must be nonpolarized and the capacitor's charging cycle is entirely dependent on the particular AC frequency utilized on the power line. For example, a capacitor charged by a power line utilizing a 60 Hz frequency would require a quarter of an AC sine-wave cycle, or approximately 4.16 msec., to be charged to one-half of the peak-to-peak voltage value of the power line. The device described in U.S. Pat. No. 4,328,482 utilizes a triac, which is triggered at each positive and negative peak of the AC line voltage, to charge the pulse-generating capacitor, as shown in FIG. 5. Subsequent to each positive and negative peak of the AC line voltage, the triac is again triggered at the immediately-following zero crossing to cause the pulse-generating capacitor to discharge. The waveform for the AC line voltage associated with the method and device described in U.S. Pat. No. 4,328,482 is shown in FIG. 3.

Because of the dependence of the charging cycle on the AC line frequency, the prior art method and device of U.S. Pat. No. 4,328,482 are limited to providing one voltage pulse per every zero crossing for each capacitor utilized. Similarly, even if one desires to transmit control pulses at points other than zero-crossing points of the waveform of the AC power line voltage, only one such control pulse may be generated per each half cycle of the waveform of the AC power line voltage. In order to provide multiple pulses, multiple capacitors must be utilized, which requirement increases the size, the number of components and the cost of the control device.

Another drawback of the prior art control device disclosed in U.S. Pat. No. 4,328,482 is that the pulse-generating capacitor must have a sufficiently large capacitance in order to generate voltage pulses having magnitudes adequate to compensate for the pulse attenuation, which varies as a function of the length of the power line. It should be readily apparent to those skilled in the art that the energy stored in a capacitor is equal to one half of the product of the capacitor capacitance and the square of the charging voltage across the capacitor. Because the maximum charging voltage of the pulse-generating capacitor in the prior art device of U.S. Pat. No. 4,328,482 is directly dependent on the AC line voltage, the only way to increase the amplitude of the discharge pulse generated by the capacitor in order to compensate for the attenuation of the pulse is to increase the capacitance value of the capacitor. Increase in capacitance translates into increase in capacitor size and cost. For example, the prior art method and device of U.S. Pat. No. 4,328,482 would require the use of a big, expensive, non-polarized capacitor in order to produce adequate voltage pulses which compensate for the attenuation of the pulses. Furthermore, the prior art control device of U.S. Pat. No. 4,328,482 is unable to generate a pulse having a magnitude greater than one-half of the peak-to-peak voltage of the AC power line.

Yet another drawback of the prior art method and device of U.S. Pat. No. 4,328,482 is that a significant power factor correction is required in order to reduce harmonic distortion of the pulse-generating, control apparatus connected to the AC power line. Power factor refers to the ratio of real (or average) power to apparent power. The power factor will reach its maximum value, unity, when the voltage and current are in phase. This situation exists when a circuit is purely resistive. For a circuit that is not purely resistive, unity power factor can also be achieved for specific element values and a specific frequency.

In the method and device described in U.S. Pat. No. 4,328,482, the pulse-generating capacitor is charged to one half of the peak-to-peak AC line voltage directly from the AC power line when the breakdown device (triac) connected in series to the pulse-generating capacitor is triggered at the positive or negative peak of the AC line voltage waveform. Since the power is taken near the AC line voltage peak, the resulting charge-current spike is very nonsinusoidal with a high content of harmonics. This situation results in a low power factor condition in which the apparent power is significantly higher than the real power.

There is therefore a need for an improved system and a method for controlling electrical devices connected to an AC power line by means of control signals transmitted via the AC power line.

OBJECTS AND SUMMARY OF THE INVENTION

The present invention provides a method and a system for controlling any electrical devices connected to an AC power line. Some examples include, without limitation, control of florescent and incandescent light bulbs, water and gas valves (AC or DC), utility plugs, motor controllers, and power line disconnects. Generally, the types of electrical devices that can be controlled via the method and apparatus of this invention are limited only by the maximum switching current and specific application criteria.

The control system according to the present invention consists of a control (or a "transmitter") apparatus and a receiver apparatus. The transmitter apparatus according to the present invention generates, and transmits via an AC power line to which the control apparatus is connected, one or more voltage pulses during any one-half cycle of the AC power line voltage. The one or more voltage pulses act as control signals for any electrical device which is connected to the AC power line and sought to be controlled (or a "slave" device). The receiver apparatus is simultaneously coupled to the slave device and the AC power line for detecting and, if necessary, decoding the voltage pulses sent by the transmitter apparatus. The receiver apparatus in turn generates a command signal that actually controls the slave device's operation.

Unlike the prior art control devices transmitting control signals over AC power lines, the method and the control system of the present invention are not directly dependent on the magnitude or the frequency of the line voltage of the AC power line to which the control system is connected. Rather, the method and the control system of the present invention utilize a boost-up voltage converter to charge a pulse-generating capacitor at a frequency of approximately 40 kHz. For an AC power line operating at 60 Hz, the pulse-generating capacitor of the present invention is charged at a frequency approximately 10,000 times faster than the required charging cycle of the prior art control devices.

In contrast to the prior art control devices, one significant advantage of the present invention derived from the capability to charge the pulse-generating capacitor at a high frequency, independent of the AC line voltage frequency, is the capability to generate voltage pulses at any moment of an AC line voltage cycle and, in particular, the capability to generate and send multiple voltage pulses within a time period of a zero crossing without utilizing multiple pulse-generating capacitors. This capability in turn allows the use of any one of several encoding techniques to facilitate high-speed, digital communication over the AC power line.

Another advantage of the present invention is the elimination of the requirement for a big, expensive, nonpolarized capacitor required in the prior art control device. This advantage flows from the fact that the amplitude of the control pulses generated by the transmitter apparatus of the present invention is controlled by adjusting the charging voltage across the pulse-generating capacitor and the duration of the discharge cycle, rather than adjusting the capacitance value of the pulse-generating capacitor. As a result, the pulse-generating capacitor in the control apparatus of the present invention may be a small, polarized, electrolytic capacitor.

Still another significant advantage of the present invention is that the amplitude of the control pulses generated by the pulse-generating capacitors may be varied within a given sequence of control pulses. This capability facilitates the selection of a desired setting of variable-setting devices such as dimming lights and volume control. Furthermore, the amplitude of the control pulses may be adjusted as a function of the distance between the transmitter apparatus and the receiver apparatus.

Yet another significant advantage of the present invention is that power factor correction is achieved, whereby the harmonic distortion generally encountered during the charging process of the pulse-generating capacitor in the prior art control devices is substantially minimized.

It is an object of the present invention to provide a system for controlling electrical devices connected to an AC power line by means of control pulses transmitted via the AC power line, which control pulses are generated at frequencies independent of the frequency and magnitude of the voltage waveform of the AC power line.

It is another object of the present invention to provide a method for controlling electrical devices connected to an AC power line by means of control pulses transmitted via the AC power line, which control pulses are generated at frequencies independent of the frequency and magnitude of the voltage waveform of the AC power line.

It is another object of the present invention to provide a system for controlling one or more electrical devices connected to an AC power line, each electrical device being controlled by means of a given set of multiple control signals transmitted via the AC power line within any one-half cycle of the AC line voltage.

It is another object of the present invention to provide a method of controlling one or more electrical devices connected to an AC power line, each electrical device being controlled by means of a given set of multiple control signals transmitted via the AC power line within any one-half cycle of the AC line voltage.

It is yet another object of the present invention to provide a system for controlling electrical devices connected to an AC power line by means of encoded digital control signals transmitted via the AC power line.

It is yet another object of the present invention to provide a method of controlling electrical devices connected to an AC power line by means of encoded digital control signals transmitted via the AC power line.

It is yet another object of the present invention to provide a system for controlling one or more electrical devices connected to an AC power line, each electrical device being controlled by means of one or more control pulses transmitted via the AC power line, the amplitude of which control pulses may be adjusted as a function of the distance the control pulses must travel along the AC power line to reach a given electrical device to be controlled.

It is yet another object of the present invention to provide a method of controlling one or more electrical devices connected to an AC power line, each electrical device being controlled by means of one or more control pulses transmitted via the AC power line, the amplitude of which control pulses may be adjusted as a function of the distance the control pulses must travel along the AC power line to reach a given electrical device to be controlled.

It is yet another object of the present invention to provide a system for controlling one or more electrical devices connected to an AC power line by means of corresponding one or more sequences of control pulses transmitted via the AC power line, the amplitude of which control pulses may be varied within the given sequence of pulses.

It is yet another object of the present invention to provide a method of controlling one or more electrical devices connected to an AC power line by means of corresponding one or more sequences of control pulses transmitted via the AC power line, the amplitude of which control pulses may be varied within the given sequence of pulses.

It is yet another object of the present invention to provide a system for controlling one or more electrical devices connected to an AC power line, each electrical device being controlled by means of one or more control pulses transmitted via the AC power line, which control system is provided with power factor correction.

It is still another object of the present invention to provide a method of controlling one or more electrical devices connected to an AC power line, each electrical device being controlled by means of one or more control pulses transmitted via the AC power line, which control method includes providing power factor correction.

DETAILED DESCRIPTION OF THE INVENTION

Figure 1:
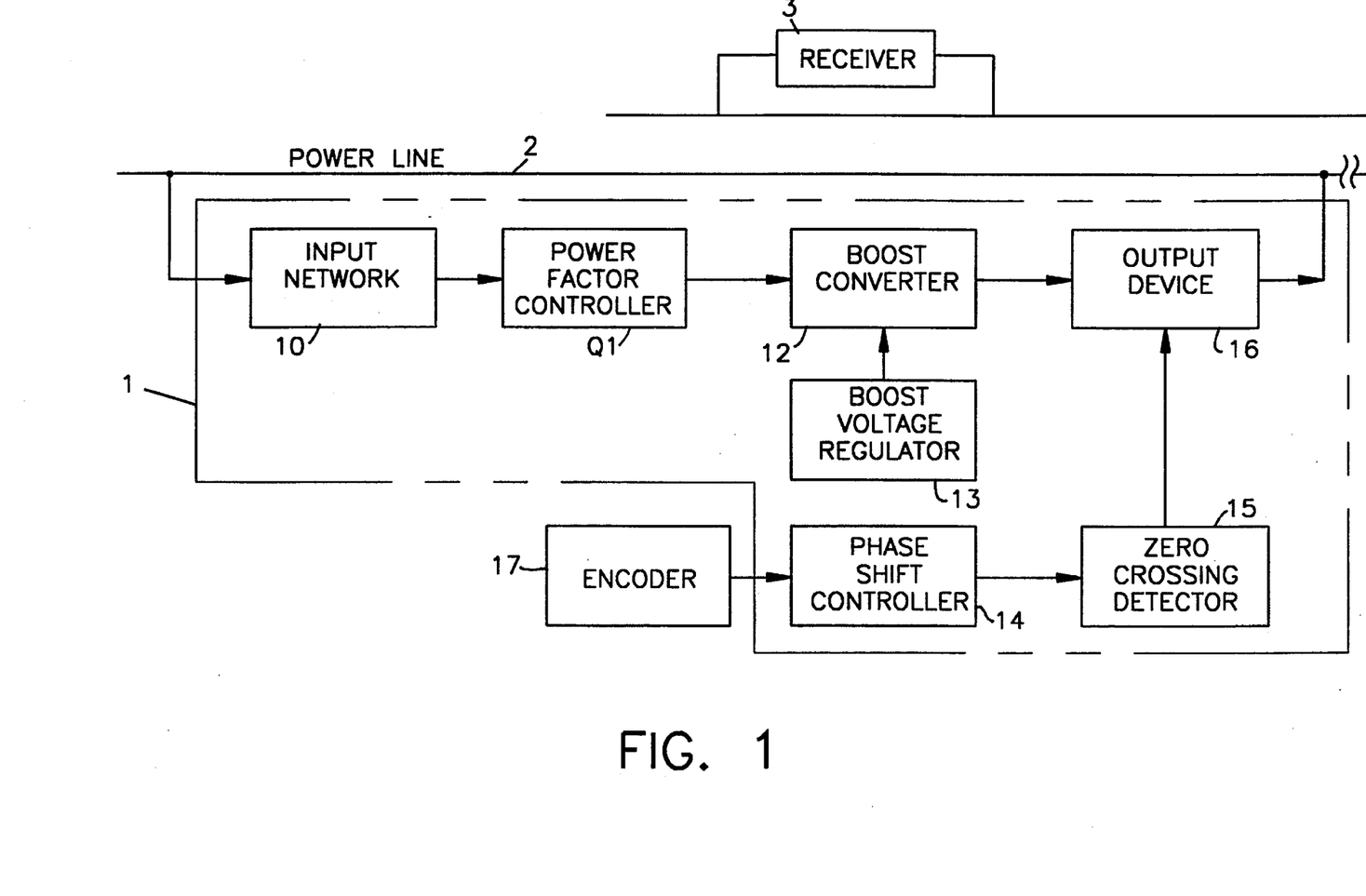
FIG. 1 is a block diagram of a preferred embodiment of the transmitter apparatus of the control system according to the present invention.

As shown in FIG. 1, the control system of the present invention includes a-transmitter apparatus 1 and a receiver apparatus 3. The transmitter apparatus 1 is connected directly to a single-phase, 120 V AC power line 2 via the input network 10 and the output device segment 16 of the transmitter apparatus. The receiver apparatus 3 is connected to the AC power line 2 at a location remote from the transmitter apparatus 3.

As shown in FIG. 1, a preferred embodiment of a transmitter apparatus 1 of the control system according to the present invention consists of an input network 10, a power factor controller Q1, a boost converter segment 12, a boost-voltage regulator segment 13, a phase-shift controller segment 14, a zero-crossing detector segment 15, and an output device segment 16. Optionally, an encoder segment 17 may be connected to the input of the phase-shift controller segment 14, as shown in FIG. 1.

Figure 2:
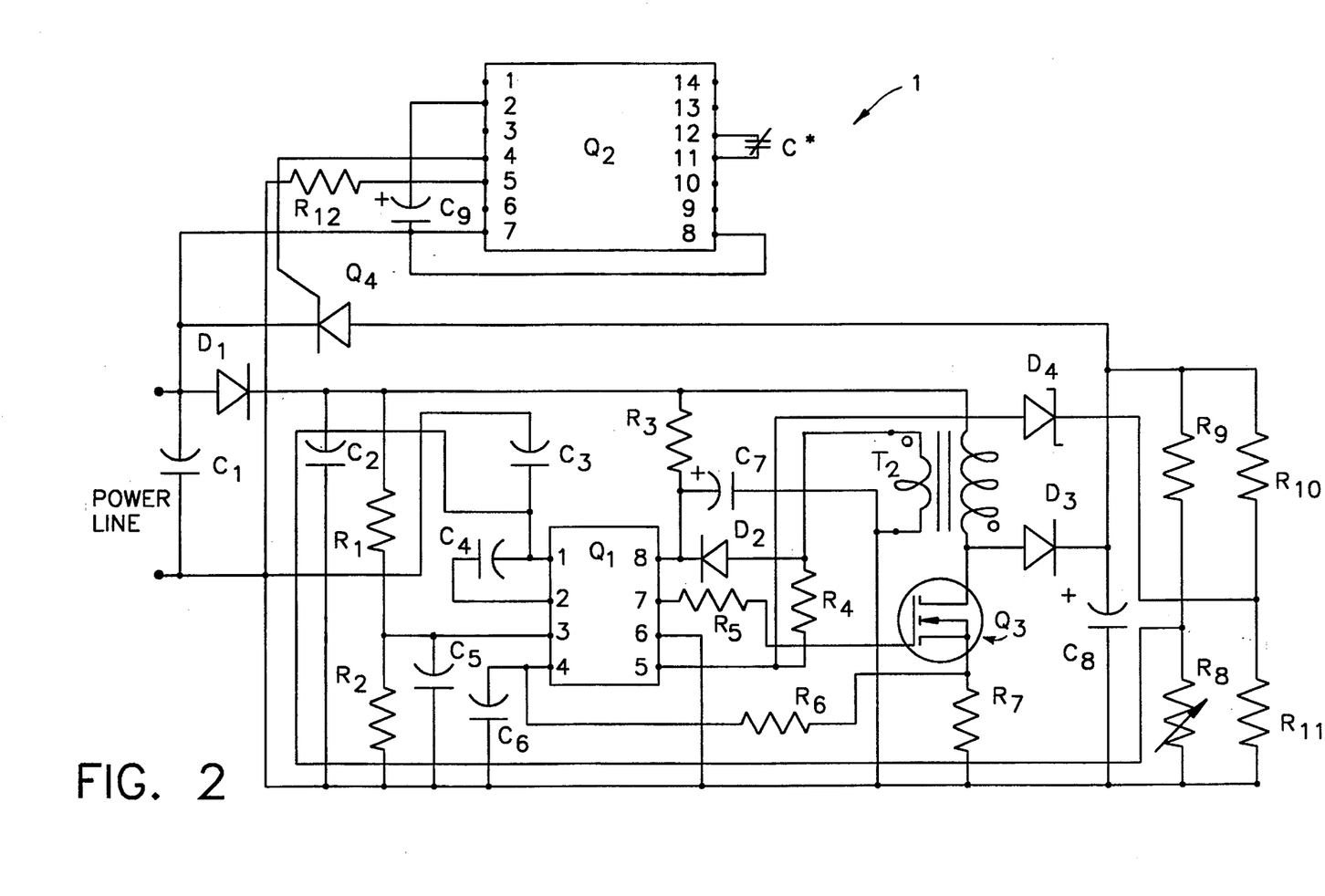
FIG. 2 is a circuit diagram of the preferred embodiment of the transmitter apparatus of the control system according to the present invention shown in FIG. 1.

As shown in FIG. 2, the input network 10 of the transmitter apparatus 1 consists of a diode D1, resistors R1–R3, and capacitors C2–C7. The input network 10, which is coupled to the power factor controller Q1, functions as an AC-to-DC converter providing DC voltage required for the operation of the power factor controller Q1, which is an integrated circuit, as shown in FIG. 2. In addition to performing the AC-to-DC conversion, the input network 10 also serves other specific filtering requirements for the power factor controller Q1. The capacitor C2 functions as a high frequency suppressor.

Power factor correction is required for any electrical circuit connected to an AC line in order to reduce the harmonic distortion experienced by the electrical circuit. As noted above, a very low power factor results when a capacitor is charged to the AC line voltage directly from the AC line. Power factor correction may be achieved by a passive circuit incorporating a combination of large capacitors, inductors and rectifiers operating at the AC line frequency. Alternatively, and preferably, power factor correction may be achieved by an active circuit utilizing a high-frequency switching converter. In the preferred embodiment of the transmitter apparatus 1 according to the present invention, power factor correction is achieved by an active circuit, i.e., the power factor controller Q1 shown in FIG. 2, which implements a boost-converter topology.

Figure 8:
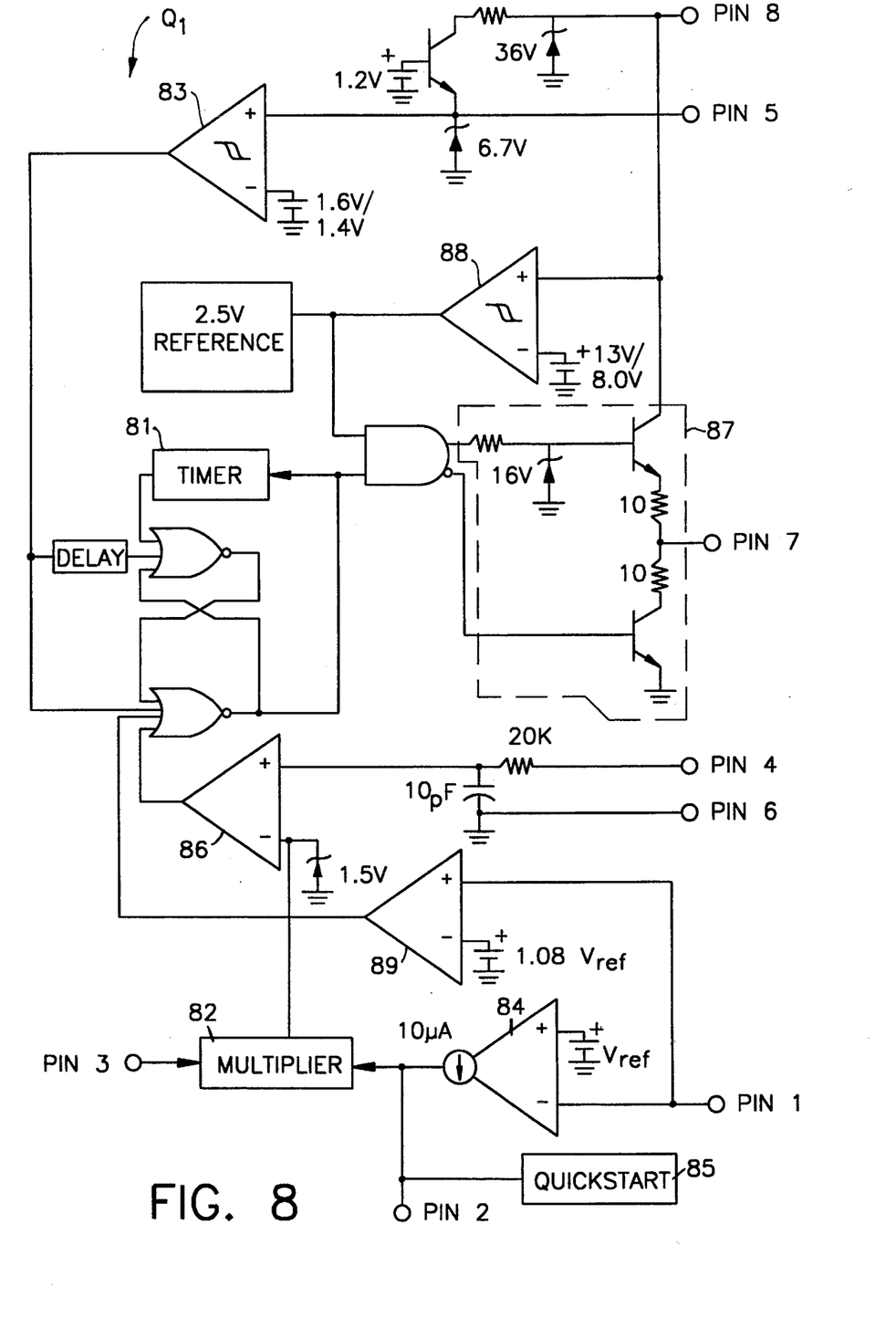
FIG. 8 is a circuit diagram of a power factor controller incorporated in the preferred embodiment of the transmitter apparatus of the control system according to the present invention shown in FIG. 2.

In the preferred embodiment of the transmitter apparatus 1 shown in FIG. 2, the power factor controller Q1 is an integrated circuit manufactured by Motorola and having the product designation MC34262 or MC33262. In this preferred embodiment, the power factor controller Q1 operates at a preset frequency of approximately 40 kHz. As shown in FIG. 8, the power factor controller Q1, which functions as a preconverter for the boost converter segment 12 of the transmitter apparatus 1, includes an internal start-up timer 81, a single-quadrant multiplier 82, a zero-current detector 83, a trans-conductance error amplifier 84, a quick-start circuit 85, a current-sensing comparator 86, an undervoltage lockout comparator 88, an overvoltage comparator 89, and a totem-pole output stage 87.

Amongst the elements of the power factor controller Q1 shown in FIG. 8, the single-quadrant multiplier 82 is the core element for achieving power factor control. The output of the single-quadrant multiplier 82 determines the threshold level of the current-sensing comparator 86 as the AC line voltage changes sinusoidally from zero to peak. As a result, the "ON" time of the MOSFET Q3 of the boost converter 12 tracks the input AC line voltage. In turn, the "ON" time of the totem-pole output stage 87 becomes fixed, thereby making the load on the power factor controller Q1 to appear resistive to the AC line 2. As mentioned above, a purely resistive load results in a unity power factor.

Amongst the remaining elements of the preferred embodiment shown in FIG. 8, the quick-start circuit 85 ensures a rapid start-up of the power factor controller Q1. The totem pole output stage 87 acts as a driver of a MOSFET output device Q3 of the boost converter segment 12 shown in FIG. 2. The undervoltage lockout comparator 88 ensures that the power factor controller Q1 is fully operational before enabling the output stage 87. The overvoltage comparator 89 protects against the occurrence of a runaway output voltage condition, which can occur during initial start-up of the power factor controller Q1 or sudden removal of load. The internal start-up timer 81 automatically restarts the power factor controller Q1 if the output stage 87 has been off for more than a specified period of time.

The main function of the boost converter segment 12 of the preferred embodiment of the transmitter apparatus 1 according to the present invention is to adjust the line voltage to a desired level for generating the control pulses of appropriate magnitude. As shown in FIG. 2, the boost converter segment 12 of the transmitter apparatus 1 includes two main elements for achieving its primary function: the MOSFET Q3 and a boost-up transformer T2. In addition, also shown in FIG. 2, a peripheral network of resistors R4–R6 and a diode D2 supports the main elements Q3 and T2. The resistor R6 provides current feedback to the power factor controller Q1. The resistor R7 limits the output current of the MOSFET Q3. The resistor R5 limits the gate current to Q3. The diode D2 and resistor R4 insure voltage build-up across the primary of the transformer T2.

In addition to the boost converter segment 12, the preferred embodiment of the transmitter apparatus 1 according to the present invention also includes the boost-voltage regulator segment 13, shown in FIG. 1, which controls the output voltage of a bulk-storage capacitor C8, which is shown in FIG. 2. More specifically, as shown in FIG. 2, a resistor R8 of the boost-voltage regulator segment 13 provides control of the output voltage of the bulk-storage capacitor C8, which functions as a pulse-generating capacitor. A resistor R9 provides voltage feedback to the power factor controller Q1. In addition, a combination of a Zener diode D4 and resistors R10 and R11 sets the zero-current detector 83 of the power factor controller Q1, shown in FIG. 8.

The output device segment 16 of the transmitter apparatus 1 consists of a standard silicon controlled rectifier (SCR) Q4 connected to the pulse-generating capacitor C8. A triggering of the SCR Q4 creates a conduction path from the pulse-generating capacitor C8, which has been previously charged to a desired voltage level, to the AC power line 2, thereby superimposing a pulse on the AC power-line waveform.

Figure 9:
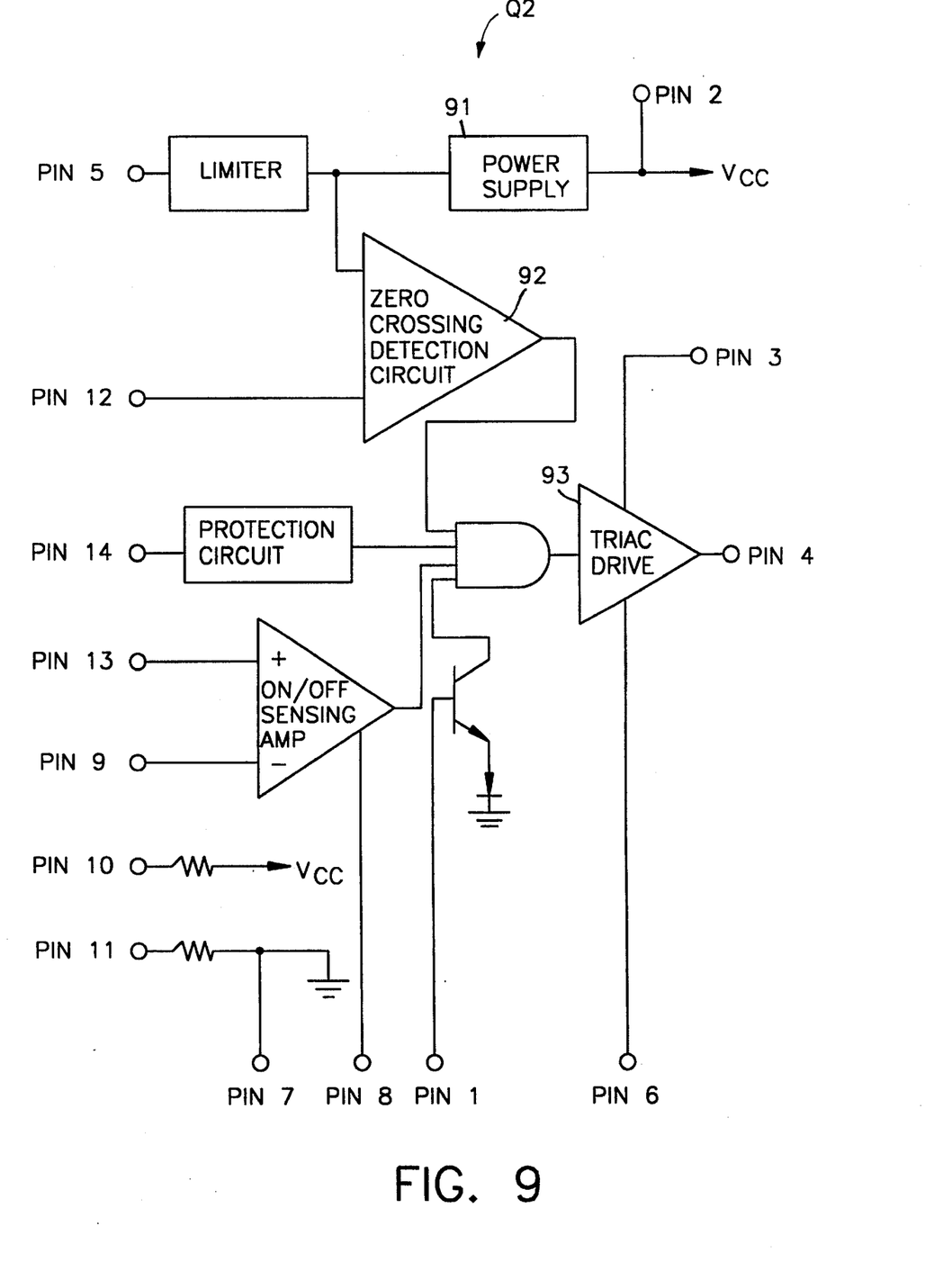
FIG. 9 is a circuit diagram of an integrated circuit incorporated in a zero-crossing-detector segment of the preferred embodiment of the transmitter apparatus of the control system according to the present invention shown in FIG. 2.

The zero-crossing detector segment 15 of the transmitter apparatus 1, shown in FIG. 1, controls the triggering of the SCR Q4 in the output device segment 16. As shown in detail in FIG. 2, the zero-crossing detector segment 15 consists of an integrated circuit Q2, a resistor R12, and a capacitor C9. In the preferred embodiment of the transmitter apparatus 1 shown in FIG. 2, the integrated circuit Q2 is a zero-voltage switch manufactured by Motorola and having the product designation CA3059 or CA3079. The integrated circuit Q2, shown in detail in FIG. 9, includes an internal power supply 91, a zero-crossing-detection circuitry 92, and a built-in driver 93 with zero drift current. The zero-crossing-detection circuitry 92 of the integrated circuit Q2 facilitates the control of the SCR Q4 to trigger and, in turn, generate control pulses from the pulse-generating capacitor C8 around zero-crossing points of the AC power line waveform. In addition, referring to FIG. 2 in conjunction with FIG. 9, the resistor R12 limits the input current from the AC power line 2 used as the operating current of the integrated circuit Q2. The capacitor C9 performs as a sync pulse, or a line frequency, conditioner.

As shown in FIGS. 1 and 2, the phase-shift controller segment 14 consists of a capacitor C*, which is used to select a desired phase shift to the right of a given zero-crossing point of the AC line voltage waveform before sending the control pulses. As will be explained below, an identical capacitor C* incorporated in a synchronous embodiment of the receiver apparatus 3 synchronizes the starting point for firing of an output device of the receiver apparatus 3 with the phase-shift of the control pulses generated by the transmitter apparatus 1. In this manner, communication between the transmitter apparatus 1 and the receiver apparatus 3 via transmission of the control pulses may be fully synchronized.

For implementing an addressing mechanism where many electrical devices must be controlled, any digital or analog encoding methods may be implemented. Because the pulse-generating capacitor C8 of the transmitter apparatus 1 may be charged approximately 40,000 times per second, or approximately 10,000 times per every quarter of an AC line-frequency cycle, the control pulses transmitted over the AC power line from the transmitter apparatus 1 may be used to implement, for example, an 8-bit encoding algorithm. A detailed circuit diagram of the encoder segment 17 is not shown since the actual configuration of the encoder segment 17, which will vary as a function of the particular encoding scheme utilized, will be readily apparent to those skilled in the art.

Figure 7:
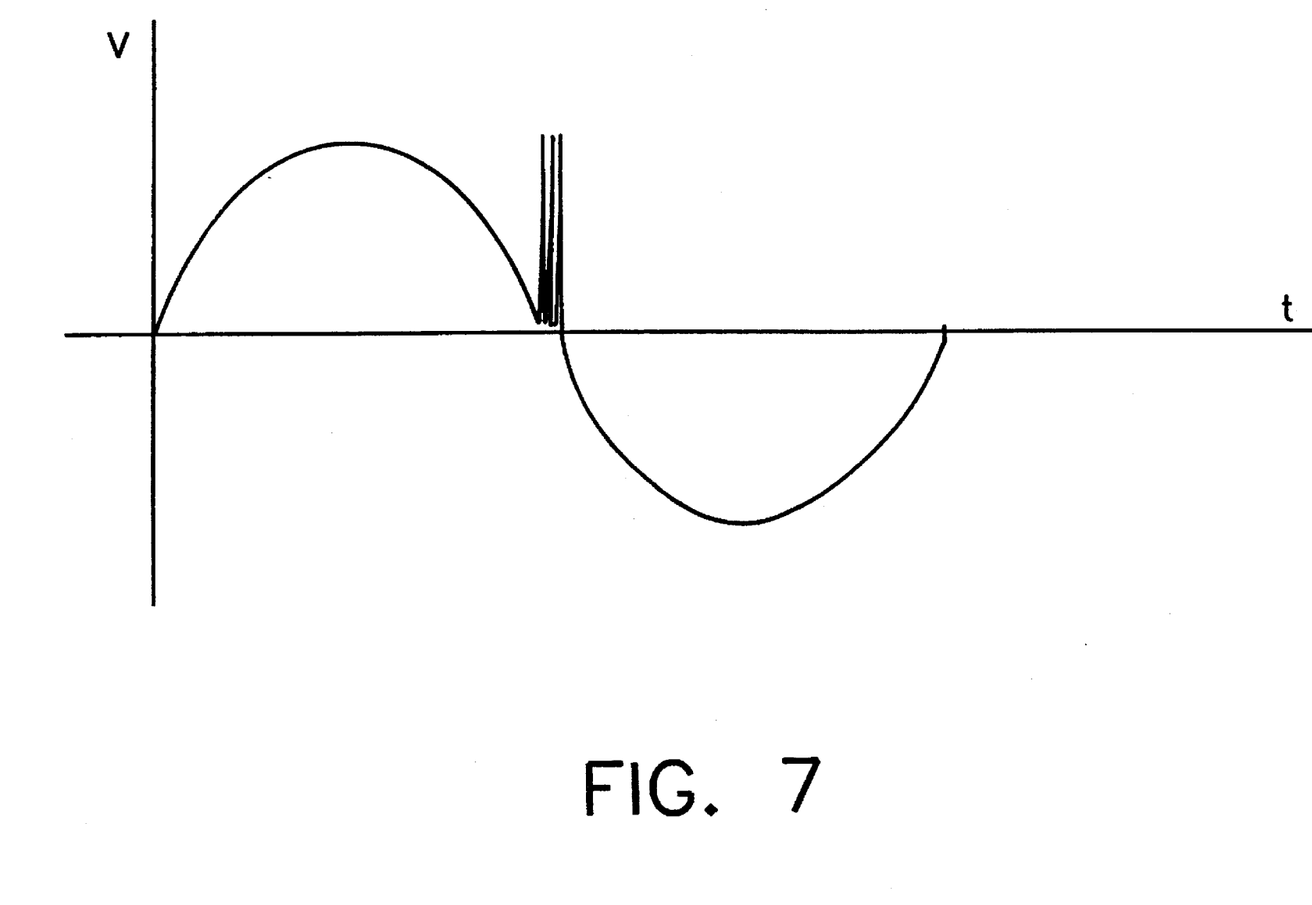
FIG. 7 is a time-versus-voltage graph of a single-phase, AC power line voltage where the transmitter apparatus according to the present invention is connected to the AC power line and transmits control pulses around a zero-crossing period.

Several advantages flow from the particular configuration of the preferred embodiment of the transmitter apparatus 1 shown in FIGS. 1 and 2. First, because the control pulses are generated independent of the frequency and magnitude of the voltage waveform of the AC power line 2 to which the transmitter apparatus is attached, multiple control pulses may be generated at any point during a given half cycle of the voltage waveform of the AC power line 2. For example, FIG. 7 shows a sequence of control pulses generated during a single zero-crossing period using the transmitter apparatus of the present invention. Furthermore, because the output voltage of the bulk-storage capacitor C8 of the transmitter apparatus 1 may be adjusted, the amplitude of the control pulses may be adjusted as a function of the distance the control pulses must travel along the AC power line 2 to reach a given electrical device to be controlled. In addition, where a sequence of control pulses are generated during a finite period encompassed within a given one-half cycle of the AC line voltage waveform, the amplitude of the individual control pulses within the pulse sequence may be varied.

The control system according to the present invention also includes a receiver apparatus 3, as shown in FIG. 1. A first preferred embodiment of the receiver apparatus 3 is shown in detail in FIG. 5. The receiver apparatus 3 detects the control pulses sent by the transmitter apparatus 1. Subsequently, the receiver apparatus 3 energizes an electrical device coupled to the receiver apparatus. Where multiple electrical devices are sought to be controlled, corresponding number of receiver apparatuses are utilized. A combination of the receiver apparatus 3 shown in FIG. 5 and the transmitter apparatus 1 shown in FIG. 2 is considered to be an asynchronous communication system.

In the receiver apparatus 3 shown in FIG. 5, an input network consisting of a potentiometer R17 and a capacitor C10 functions as a high-frequency RC filter with sensitivity adjustment. A control pulse sent by the transmitter apparatus 1 is detected by the high-frequency RC filter and turn the MOSFET switch Q3 on for a period of time equal to the pulse width of the transmitter signal. When the MOSFET switch Q3 is conductive, a current flows through a resistor R18 and a diode D5, thereby charging a capacitor C11 to a voltage level that results in conduction of the photodiode of an optocoupler Q5. When the optocoupler Q5 becomes conductive, the surge current through the optocoupler Q5 triggers a triac Q6, which in turn energizes an electrical device, i.e., a "slave" device to be controlled, connected to the receiver apparatus 3.

Figure 6:
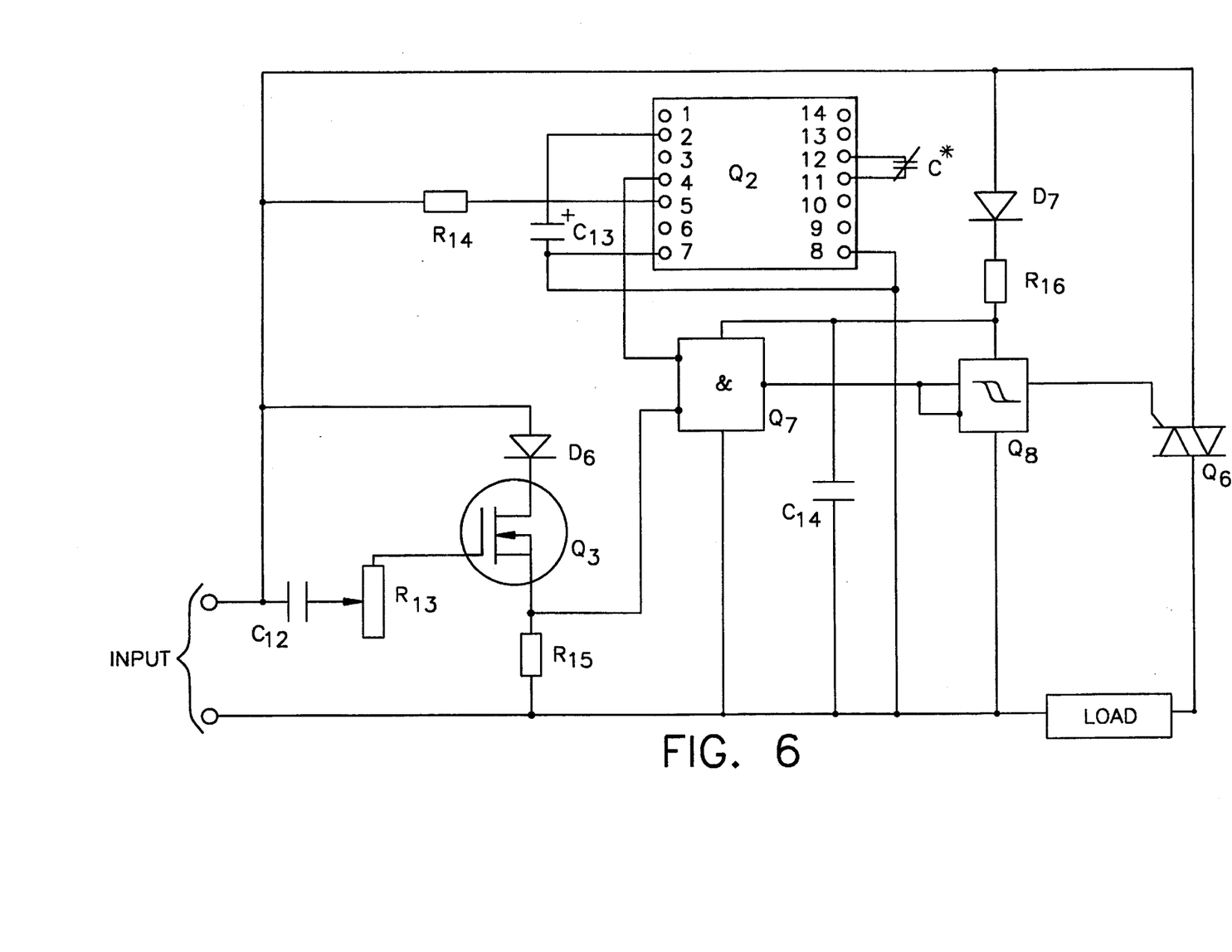
FIG. 6 is a second preferred embodiment of the receiver apparatus of the control system according to the present invention.

A second preferred embodiment of the receiver apparatus 3 of the control system according to the present invention is shown in FIG. 6. A combination of the receiver apparatus 3 shown in FIG. 6 and the transmitter apparatus 1 shown in FIG. 2 is considered to be a synchronous communication system. As can be seen in FIG. 6, the second preferred embodiment of the receiver apparatus 3 is constructed around a circuit segment which is substantially similar to the zero-crossing detector segment 15 of the transmitter apparatus 1 shown in FIGS. 1 and 2.

The input network of the second preferred embodiment of the receiver apparatus 3 shown in FIG. 6 is substantially similar to the input network of the first preferred embodiment of the receiver apparatus shown in FIG. 5. The input network consisting of a potentiometer R13 and a capacitor C12 functions as a high-frequency RC filter with sensitivity adjustment. Control pulses sent by the transmitter apparatus 1 are detected by the high-frequency RC filter and turn the MOSFET switch Q3 on for a period of time equal to the pulse width of the transmitter signal, thereby turning ON one of the two input signals to an AND gate Q7. At the same time, as shown in FIG. 6, the integrated circuit Q2 serves as a shift register for the control pulses generated by the transmitter apparatus 1, turning ON the second input signal to the AND gate Q7. A Schmitt trigger Q8, which is driven by the output of the AND gate Q7, fires a triac Q6 to energize an electrical device attached thereto. The capacitor C* of the second preferred embodiment of the receiver apparatus 3, which capacitor is also incorporated in the transmitter apparatus 1 shown in FIG. 2, determines the starting point for triggering the Schmitt trigger Q8 of the receiver apparatus, which starting point is synchronized with the phase-shift of the control pulses generated by the transmitter apparatus 1.

If the control pulses generated by the transmitter apparatus 1 are used to implement an encoding scheme, an optional decoding circuitry may be incorporated in either the first or the second embodiment of the receiver apparatus 3. A detailed diagram of the optional decoding circuitry is not shown since the actual configuration, which will vary as a function of the particular encoding scheme utilized, will be readily apparent to those skilled in the art.

Some possible applications of the control system according to the present invention include: remote control of electronic warning devices—burglar alarms, smoke alarms, etc; remote control of electronic circuit breakers; "the house of the future"—a full control of all lights, heaters, air conditioning units, refrigerators, etc., from a stand-alone computer or control device connected to a wall outlet without any switches and separate communication wires; and remote control of dimmers and proportionally controlled devices.

While specific, preferred embodiments have been described above, it should be understood that the above-described embodiments are exemplary in nature and are not to be construed as limiting the scope of protection for the invention as set forth in the appended claims. Numerous modifications to, or variations of, the above-described preferred embodiments should be readily apparent to those of ordinary skill in the art, and these modifications and variations are intended to be encompassed within the scope of protection as set forth in the appended claims. For example, although the preferred embodiments have been described in connection with a single-phase, 120 V AC power line, the control system of the present invention may be used in connection with any operating voltage and multiple-phase configurations. In addition, although the power factor controller Q1 of the present invention has been described as operating at a preset frequency of 40 kHz, the operating frequency may be varied. Also, the receiver apparatus may be constructed to be identical to the transmitter apparatus, thereby allowing two-way communication.

We claim:

1. An apparatus for controlling one or more electrical devices connected to an AC power line at corresponding one or more remote locations from the apparatus by means of control signals transmitted over the AC power line, the control signals being superimposed on the voltage waveform of the AC power line, said apparatus comprising:

a breakdown device;

a capacitor in series with the breakdown device;

means for charging the capacitor to one of several voltage levels at least twice during any one-half cycle of the voltage waveform of the AC power line; and means for triggering the breakdown device one or more number of times at any point during any one-half cycle of the voltage waveform of the AC power line;

wherein each of said triggering of the breakdown device causes the capacitor to discharge a pulse onto the AC power line.

2. The apparatus according to claim 1, wherein the capacitor charging means adjusts the charging voltage across the capacitor for a charging cycle preceding each pulse.

3. The apparatus according to claim 2, wherein the amplitude of the control pulses discharged onto the AC power line is independent of one-half of the peak-to-peak amplitude of the voltage waveform of the AC power line.

4. The apparatus according to claim 3, wherein the means for triggering the breakdown device triggers the breakdown device a plurality of times during a zero-crossing period of the voltage waveform of the AC power line, each instance of triggering producing a pulse from the capacitor.

5. The apparatus according to claim 4 further comprising means for reducing harmonic distortions experienced by the apparatus.

6. The apparatus according to claim 5, wherein the means for reducing harmonic distortions comprises a circuit for improving power factor of the apparatus.

7. The apparatus according to claim 3, wherein the means for triggering the breakdown device triggers the breakdown device a plurality of times during any half-cycle period of the voltage waveform of the AC power line, and wherein the magnitude of the resulting pulses is nonuniform.

8. The apparatus according to claim 3, wherein the capacitor charging means charges the capacitor at a frequency approximately two orders of magnitude greater than the frequency of the voltage waveform of the AC power line.

9. A system for controlling one or more electrical devices connected to an AC power line by means of control signals transmitted over the AC power line, the control signals being superimposed on the voltage waveform of the AC power line, said system comprising:

a transmitter means for transmitting one or more pulses at any point during any one-half cycle of the voltage waveform of the AC power line, said transmitter means having a capacitor, means for charging the capacitor to one of several voltage levels at least twice during any one-half cycle of the voltage waveform of the AC power line, and means for discharging the capacitor one or more times at any point during any one-half cycle of the voltage waveform of the AC power line to generate said one or more pulses; and a receiver means electrically coupled to a corresponding one of said one or more electrical devices to be controlled, said receiver means having means for detecting said one or more pulses transmitted from the transmitter means and means for energizing said corresponding one of said one or more electrical devices in response to said one or more pulses transmitted from the transmitter apparatus.

10. The system according to claim 9, wherein said capacitor charging means of said transmitter means charges said capacitor at a frequency approximately two orders of magnitude greater than the frequency of the voltage waveform of the AC power line.

11. The system according to claim 10, wherein said transmitter means transmits a plurality of pulses during a zero-crossing period of the voltage waveform of the AC power line for controlling a selected receiver means, and wherein the capacitor charging means adjusts the charging voltage across the capacitor for a charging cycle preceding each pulse.

12. The system according to claim 11, wherein magnitude of said plurality of pulses is nonuniform.

13. The system according to claim 9, wherein said transmitter means transmits one or more pulses at any point during any one-half cycle of the voltage waveform of the AC power line for controlling a selected receiver means, magnitude of said one or more pulses being adjusted as a function of the distance between the transmitter means and the receiver means.

14. The system according to claim 9, wherein said transmitter means transmits one or more pulses during a non-zero period of the voltage waveform of the AC power line for controlling a selected receiver means, said non-zero period having a selected phase-shift to the right of a given zero-crossing period, and wherein the capacitor charging means adjusts the charging voltage across the capacitor for a charging cycle preceding each pulse.

15. The system according to claim 14, wherein said means for energizing said electrical devices comprises a breakdown device and a means for triggering said breakdown device, and wherein a triggering point of said breakdown device is synchronized with said selected phase-shift of said non-zero period of the voltage waveform relative to said given zero-crossing period.

16. The system according to claim 15, wherein said transmitter means transmits a plurality of pulses, and wherein magnitude of said plurality of pulses is nonuniform.

17. A method of controlling one or more electrical devices connected to an AC power line by means of a control system utilizing one or more pulses transmitted over the AC power line, said one or more pulses being superimposed on the voltage waveform of the AC power line, said control system comprising a transmitter means and a receiver means, said receiver means being electrically coupled to a corresponding one of said one or more electrical devices to be controlled, said transmitter means having a capacitor, means for charging the capacitor, and means for discharging the capacitor to generate said one or more pulses, said receiver means having means for detecting said one or more pulses generated by the transmitter means and means for energizing said corresponding one of said one or more electrical devices, said method comprising:

charging the capacitor to one of several voltage levels one or more times at any point during any one-half cycle of the voltage waveform of the AC power line using the capacitor charging means;

discharging said capacitor one or more times during any one-half cycle of the voltage waveform of the AC power line to generate said one or more pulses onto the AC power line;

detecting at said receiver means said one or more pulses transmitted from the transmitter; and energizing via said energizing means said corresponding one of said one or more electrical devices in response to said one or more pulses transmitted from the transmitter.

18. The method according to claim 17, wherein the step of charging the capacitor comprises charging the capacitor a plurality of times during any one-half cycle of the voltage waveform of the AC power line, said capacitor charging means adjusting the voltage across the capacitor for each charging cycle.

19. The method according to claim 18, wherein:

the step of discharging said capacitor comprises discharging said capacitor said plurality of times during any one-half cycle of the voltage waveform of the AC power line to generate said plurality of pulses, said plurality of pulses each having a selected phase-shift from a given zero-crossing point of the voltage waveform of the AC power line; and the step of energizing said corresponding one of said electrical devices comprises triggering said energizing means at a point of the voltage waveform of the AC power line having said selected phase-shift from said given zero-crossing point of the voltage waveform for the first pulse of said plurality of pulses.

20. An apparatus for controlling one or more electrical devices connected to an AC power line at corresponding one or more remote locations from the apparatus by means of one or more pulses transmitted over the AC power line, said one or more pulses being superimposed on the voltage waveform of the AC power line, said apparatus comprising:

a breakdown device;

a capacitor in series with the breakdown device;

means for charging the capacitor to one of several voltage levels at least twice during any one-half cycle of the voltage waveform of the AC power line;

a circuit for reducing harmonic distortion of the transmitter apparatus; and means for triggering the breakdown device at least twice during any one-half cycle of the voltage waveform of the AC power line;

wherein each of said triggering of the breakdown device causes the capacitor to discharge a pulse onto the AC power line, and wherein the amplitude of each of the pulses discharged onto the AC power line is independent of one-half of the peak-to-peak amplitude of the voltage waveform of the AC power line.

* * * * *